US010152276B2

United States Patent
Chan

(10) Patent No.: US 10,152,276 B2
(45) Date of Patent: Dec. 11, 2018

(54) MEMORY DEVICE INCLUDING DATA PROCESSOR AND PROGRAM METHOD OF SAME

(71) Applicant: WINBOND ELECTRONICS CORPORATION, Taichung (TW)

(72) Inventor: Johnny Chan, Fremont, CA (US)

(73) Assignee: Winbond Electronics Corporation, Taichung (TW)

( * ) Notice: Subject to any disclaimer, the term of this patent is extended or adjusted under 35 U.S.C. 154(b) by 0 days.

(21) Appl. No.: 15/212,950

(22) Filed: Jul. 18, 2016

(65) Prior Publication Data

US 2018/0018132 A1  Jan. 18, 2018

(51) Int. Cl.
*G11C 8/00* (2006.01)
*G11C 11/56* (2006.01)
*G06F 3/06* (2006.01)
*G11C 7/00* (2006.01)
*G11C 8/10* (2006.01)
*G11C 7/10* (2006.01)

(52) U.S. Cl.
CPC .......... *G06F 3/0659* (2013.01); *G06F 3/0619* (2013.01); *G06F 3/0688* (2013.01); *G11C 7/00* (2013.01); *G11C 7/1006* (2013.01); *G11C 8/10* (2013.01); *G11C 2207/2245* (2013.01)

(58) Field of Classification Search
None
See application file for complete search history.

(56) References Cited

U.S. PATENT DOCUMENTS

| 5,845,275 | A | * | 12/1998 | Le Van Suu | G01R 19/25 324/132 |
| 6,028,795 | A | * | 2/2000 | Kimura | G06T 1/60 365/189.16 |
| 7,139,003 | B1 | * | 11/2006 | Kirk | G06F 9/3836 345/506 |
| 8,060,691 | B2 | | 11/2011 | Pyeon et al. | |
| 8,281,064 | B2 | | 10/2012 | Oh et al. | |
| 8,719,517 | B2 | | 5/2014 | Li et al. | |
| 2009/0259803 | A1 | | 10/2009 | Oh et al. | |
| 2012/0069633 | A1 | * | 3/2012 | Katoh | G11C 13/004 365/148 |
| 2014/0289440 | A1 | * | 9/2014 | Shu | G11C 7/1012 710/307 |

FOREIGN PATENT DOCUMENTS

TW  200949534 A1  12/2009

* cited by examiner

*Primary Examiner* — Son Dinh
*Assistant Examiner* — Sultana Begum
(74) *Attorney, Agent, or Firm* — Finnegan, Henderson, Farabow, Garrett & Dunner LLP

(57) ABSTRACT

A memory device includes a memory array including a plurality of memory cells that store data, a sense circuit coupled to the memory array for reading data stored in the memory array, a data register for storing data to be written into the memory array, a data processor, and a control unit. The data processor is configured to receive input data units to be written into the memory array, and process the input data units based on array data units stored in the memory array to generate processed data units. The control unit is configured to write the processed data units into the memory array.

15 Claims, 6 Drawing Sheets

MEMORY DEVICE INCLUDING DATA PROCESSOR AND PROGRAM METHOD OF SAME

FIELD OF THE DISCLOSURE

The present disclosure relates to a memory device and a program method of the memory device.

BACKGROUND

Flash memory devices have been adopted in a wide variety of applications. The flash memory devices store data by program operations that change the threshold voltages of a plurality of memory cells included in the flash memory devices. The flash memory devices need to be reliable such that data can be correctly stored in the memory devices.

SUMMARY

According to an embodiment of the disclosure, a memory device includes a memory array including a plurality of memory cells that store data, a sense circuit coupled to the memory array for reading data stored in the memory array, a data register for storing data to be written into the memory array, a data processor, and a control unit. The data processor is configured to receive input data units to be written into the memory array, and process the input data units based on array data units stored in the memory array to generate processed data units. The control unit is configured to write the processed data units into the memory array.

According to another embodiment of the disclosure, a method for programming a memory array includes receiving input data units to be written into the memory array, processing the input data units based on array data units stored in the memory array to generate processed data units, and writing the processed data units into the memory array.

The accompanying drawings, which are incorporated in and constitute a part of this application, illustrate disclosed embodiments and, together with the description, serve to explain the disclosed embodiments.

DETAILED DESCRIPTION

Reference will now be made in detail to the present embodiments, examples of which are illustrated in the accompanying drawings. Wherever possible, the same reference numbers will be used throughout the drawings to refer to the same or like parts.

Figure 1:
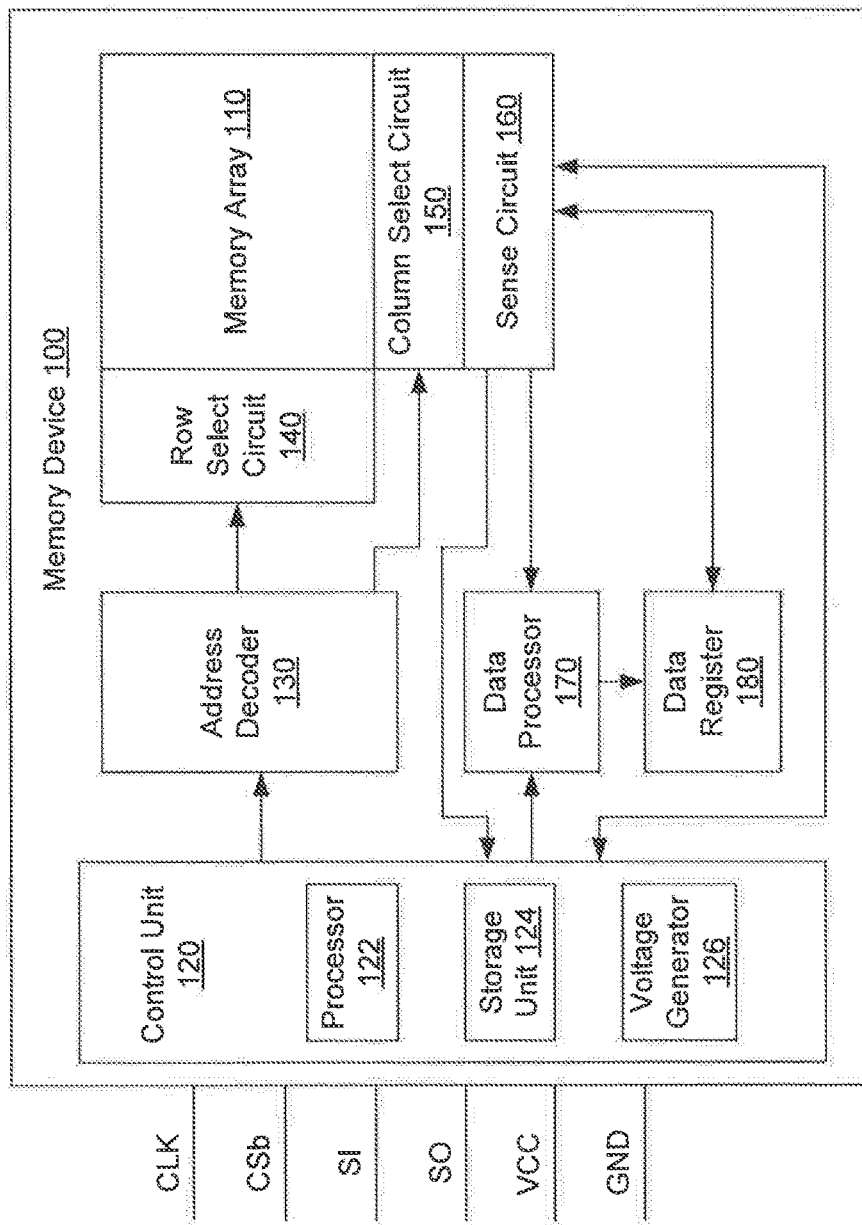
FIG. 1 is a schematic diagram illustrating a memory device according to an illustrated embodiment.

FIG. 1 is a schematic diagram illustrating a memory device 100 according to an illustrated embodiment. Memory device 100 can be a non-volatile memory device such as, for example, a flash memory device, a Resistive Random Access Memory (ReRAM) device, or a Magnetoresistive Random Access Memory (MRAM) device. Memory device 100 includes a memory array 110, a control unit 120, an address decoder 130, a row select circuit 140, a column select circuit 150, a sense circuit 160, a data processor 170, and a data register 180. Memory device 100 also includes a plurality of pins for communicating with an external device (not shown), such as a clock (CLK) pin, a chip select (CSb) pin, a serial input (SI) pin, a serial output (SO) pin, a power (VCC) pin, and a ground (CND) pin.

Memory array 110 includes a plurality of memory cells (not shown) arranged in rows and columns between a plurality of word lines (not shown) and a plurality of bit lines (not shown). The gates of each row of memory cells are commonly connected to a respective one of the plurality of word lines. Each column of memory cells are connected to a respective one of the plurality of bit lines.

Control unit 120 is coupled to the plurality of pins, and is configured to receive commands, addresses, and input data transmitted from the external device via the SI pin and control operations of various components of memory device 100, such as address decoder 130, row select circuit 140, column select circuit 150, sense circuit 160, and data processor 170 in response to the commands. In the embodiment illustrated in FIG. 1, control unit 120 includes a processor 122, a storage unit 124, and a voltage generator 126. Storage unit 124 is configured to store instructions executed by processor 122 to control operations of the various components of memory device 100 in response to the commands. Processor 122 is a general-purpose processor that can be configured to execute the instructions stored in storage unit 124. Voltage generator 126 is configured to generate various voltages for controlling the operations of the various components of memory device 100. In an alternative embodiment, control unit 120 can include special-purpose logic circuits that are configured to control operations of the various components of memory device 100.

Address decoder 130 is coupled to control unit 120, row select circuit 140, and column select circuit 150, and is configured to receive an address transferred from control unit 120 and decode the received address to obtain a row address and a column address in memory array 110. Address decoder 130 is also configured to transfer the row address to row select circuit 140 and the column address to column select circuit 150.

Row select circuit 140 is coupled to memory array 110 and is configured to receive the row address from address decoder 130, and supply word line voltages to the word lines of memory array 110 to select at least one word line according to the row address.

Column select circuit 150 is coupled to memory array 110 and is configured to receive the column address from address decoder 130, and supply bit line voltages to the bit lines of memory array 110 to select at least one bit line according to the column address.

Sense circuit 160 is coupled to memory array 110 and is configured to read array data stored in memory array 110, and transfer the array data to control unit 120 or to data processor 170.

Data processor 170 is coupled between control unit 120 and sense circuit 160, and is configured to receive input data from control unit 120 and array data from sense circuit 160, process the input data based on the array data to generate processed data, and write the processed data into data register 180.

Data register 180 is coupled to data processor 170 and is configured to store data to be written into memory array 110. For example, data register 180 stores processed data generated by data processor 170.

Although control unit 120, address decoder 130, row select circuit 140, column select circuit 150, sense circuit 160, data processor 170, and data register 180 are illustrated as separate components those skilled in the art will now recognize that components can be combined into one circuit.

Figure 2:
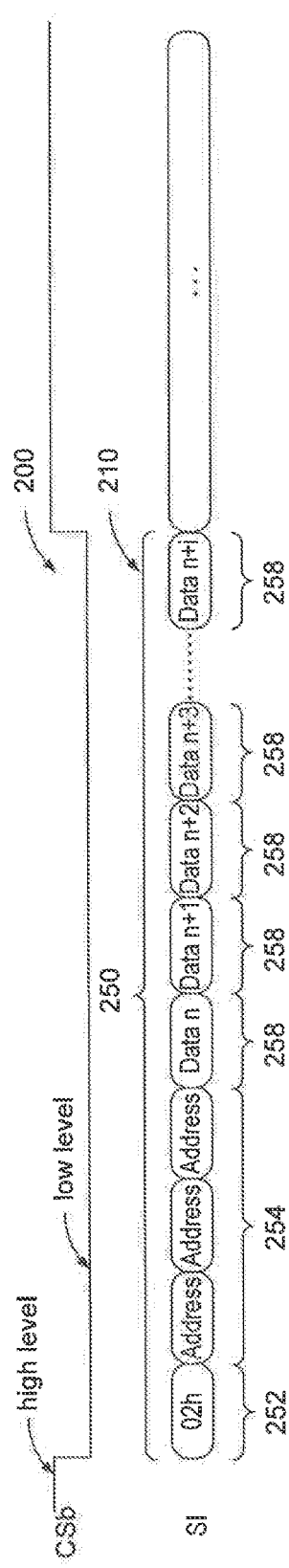
FIG. 2 is a timing diagram illustrating signals supplied to the memory device of FIG. 1 for programming the memory device, according to an illustrated embodiment.

FIG. 2 is a timing diagram illustrating signals supplied to memory device 100 for programming memory array 110, according to an illustrated embodiment. Specifically, a chip select (CSb) signal 200 is supplied to the CSb pin of memory device 100, and a serial input (SI) signal 210 is supplied to the SI pin of memory device 100.

According to FIG. 2, when CSb signal 200 supplied to the CSb pin is driven from a high level to a low level, serial input (SI) signal 210 including an instruction sequence 250 is supplied to the SI pin of memory device 100. Instruction sequence 250 includes a program instruction 252, an address 254, and a series of input data units 258 to be programmed into memory array 110. Program instruction 252, address 254, and the series of input data units 258 are serially transmitted from the external device. In the embodiment illustrated in FIG. 2, program instruction 252 is an 8-bit instruction code "02h", which instructs memory device 100 to execute a program operation. Address 254 consists of 24 bits of address data, and represents an initial address n of a location in memory array 110 into which the plurality of input data units 258 are to be programmed. The series of input data units 258 include data unit n (denoted in FIG. 2 as "Data n"), data unit n+1 (denoted in FIG. 2 as "Data n+1"), . . . , data unit n+i (denoted in FIG. 2 as "Data n+i"). Data unit n is to be programmed into the location in memory array 110 corresponding to the initial address n, data unit n+1 is to be programmed into the location corresponding to an address n+1, and so on. Each one of the plurality of input data units 258 includes a plurality of input data bits. For example, each one of the plurality of input data units 258 includes 8 bits of "0"s and "1"s as input data bits.

In a conventional memory device, when control unit 120 receives instruction sequence 250, control unit 120 will write the plurality of input data units 258 included in instruction sequence 250 into data register 180. Then, when CSb signal 200 is driven from the low level to the high level, control unit 120 will execute an embedded program operation to program each one of input data units 258 into memory array 110, starting from a location represented by address 254.

Generally, each one of the plurality of memory cells in memory array 110 can be a single level cell (SLC) that stores one data bit of "1" or "0". If memory device 100 is a flash memory device, a memory cell that stores "1" can be programmed to store "0" by a program operation, Before the program operation, an erase operation can be performed to erase a block of memory cells to store "1". However, in some cases, when a memory cell has already stored "0", an external device might still instruct the memory device to program "0" into the memory cell. Such scenario is referred to as "over-programming", Excessive over-programming of a memory cell may deteriorate the integrity of the memory cell.

In order to avoid over-programming, according to an embodiment of the present disclosure, after the entire series of input data units 258 are received by memory device 100 and during the embedded program operation, array data units stored in a set of memory cells in memory array 110 are checked and compared with the input data units 258, and the embedded program operation only programs "0" into a memory cell that stores "1". However, the checking process is time consuming, and thus prolongs the process for the embedded program operation.

Figure 3:
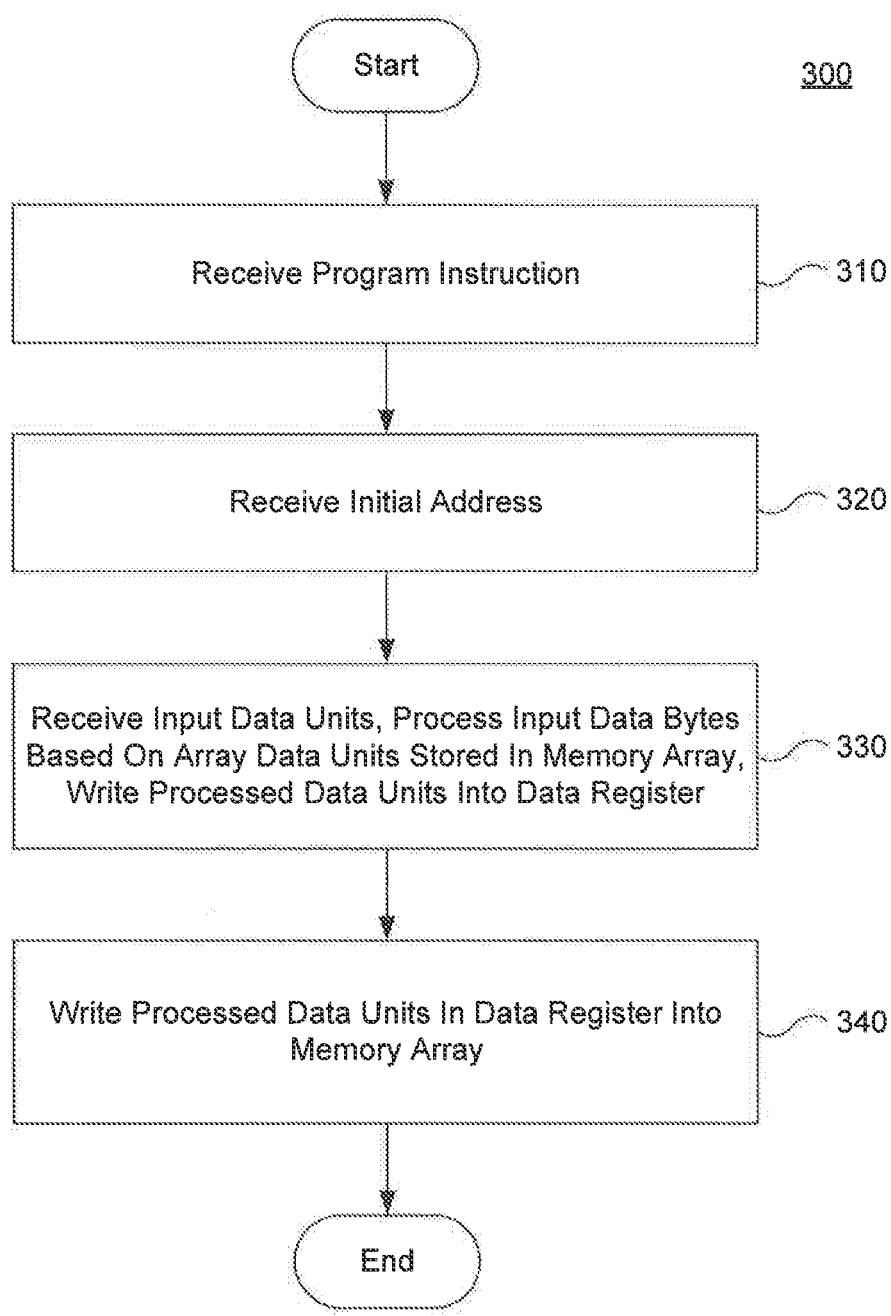
FIG. 3 is a flow chart illustrating a process of programming the memory device of FIG. 1, according to an illustrated embodiment.

In contrast, in a program method according to the embodiments described below, the array data units stored in memory array 110 are read and each array data unit is compared with the corresponding input data unit as soon as the corresponding input data unit is input into memory device 100. FIG. 3 is a flow chart illustrating a process 300 of programming memory device 100, according to such an embodiment. Process 300 can be executed by control unit 120 of FIG. 1.

Referring to FIG. 3, at step 310, control unit 120 receives a program instruction transmitted from an external device. For example, control unit 120 of memory device 100 receives program instruction 252 included in instruction sequence 250 via the SI pin of memory device 100.

At step 320, control unit 120 receives an initial address transmitted from the external device. For example, control unit 120 of memory device 100 receives address 254 included in instruction sequence 250 via the SI pin of memory device 100. Address 254 represents the initial address of the location in memory array 110 where the plurality of input data units 258 are to be programmed.

At step 330, control unit 120 receives a series of input data units transmitted from the external device, processes the input data units based on array data units stored in memory array 110 to generate processed data units while receiving the series of input data units, and writes the processed data units into data register 180. For example, control unit 120 of memory device 100 can receive the plurality of input data units 258 included in instruction sequence 250 via the SI pin of memory device 100. When control unit 120 receives one of the input data units, control unit 120 processes the input data unit based on an array data unit stored in a corresponding location in memory array 110, and writes the processed data unit into data register 180. Detailed description regarding step 330 will be provided with reference to FIG. 4.

At step 340, control unit 120 performs a program operation to write the processed data units in data register 180 into memory array 110 starting from the initial address. Detailed description regarding step 340 will be provided with reference to FIG. 5. Process 300 finishes after step 340.

Figure 4:
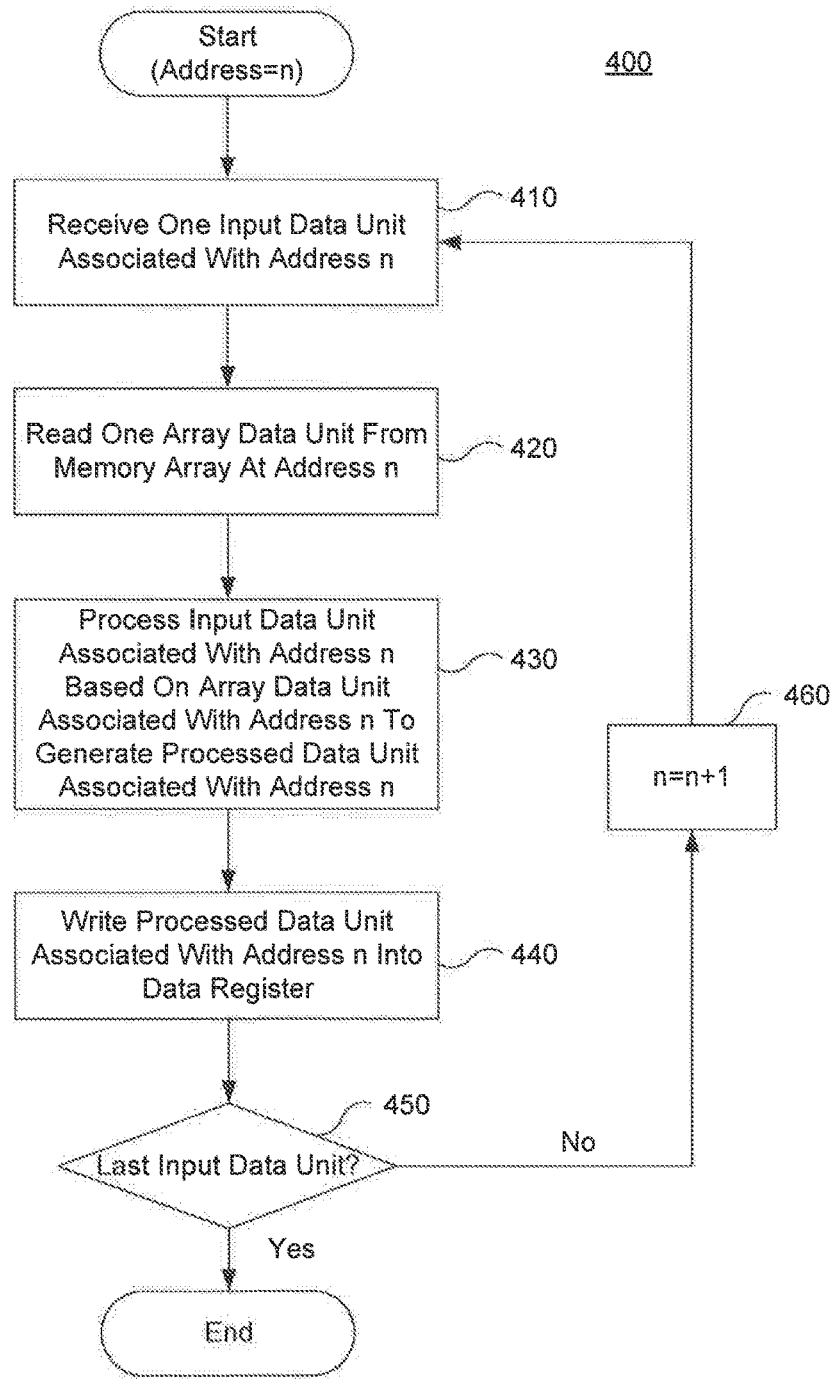
FIG. 4 is a flow chart illustrating a process of executing a step in the process of FIG. 3, according to an illustrated embodiment.

FIG. 4 is a flow chart illustrating a process 400 for executing step 330 in FIG. 3, according to an illustrated embodiment. Process 400 can be executed by control unit 120 of FIG. 1.

As previously described, before process 400 starts, control unit 120 has received the initial address transmitted from the external device, and the initial address represents the starting location in memory array 110 where the plurality of input data units 258 are to be programmed. It is assumed that at the beginning of process 400, the initial address is n.

At step 410, control unit 120 receives an input data unit transmitted from the external device. The input data unit is associated with address n. That is, the input data unit is to be written into a location in memory array 110 having address n. The input data unit includes a fixed number of input data bits. For example, the input data unit includes eight (8) input data bits "01010010" to be written into a plurality of memory cells in memory array 110 having address n.

At step 420, control unit 120 controls sense circuit 160 to read an array data unit from memory array 110 at address n. The array data unit includes a fixed number of array data bits, and has the same length as the input data unit. The plurality of array data bits in the array data unit respectively correspond to the plurality of input data bits in the input data unit. For example, the array data unit includes eight (8) array data bits, i.e., "00101010".

At step 430, control unit 120 controls data processor 170 to process the input data unit based on the array data unit to generate a processed data unit. The processed data unit includes a plurality of processed data bits respectively corresponding to the plurality of input data bits in the input data unit.

In some embodiments, when memory device 100 is a flash memory device, data processor 170 compares each input data bit in the input data unit and a corresponding one of the array data bits in the array data unit. When both of the input data bit and the array data bit are "0", data processor 170 changes the input data bit from "0" into "1" to generate a processed data bit of "1" as the corresponding processed data bit. When performing a program operation in a following step, only processed data bits of "0" will be programmed into memory array, while processed data bits of "1" will not be programmed. Thus, as a result of processing the input data unit at step 430, memory device 100 will only program "0" over the memory cells that store an array data bit of "1".

Table 1 summarizes a scheme for processing the input data bits in the input data unit, according to an exemplary embodiment.

TABLE 1

|  | Array Data Bit | |
| --- | --- | --- |
| Processed Data Bit | 0 | 1 |
| Input Data Bit     0 | 1 | 0 |
|                    1 | 1 | 1 |

According to Table 1, when an array data bit is "0" and the corresponding input data bit is "0", the processed data bit will be "1", which will not be programmed; when an array data bit is "0" and the corresponding input data bit is "1", the processed data bit will be "1", which will not be programmed: when an array data bit is "1" and the corresponding input data bit is "0", the processed data bit will be "0", which will be programmed; and when an array data bit is "1" and the corresponding input data bit is "1" the the data bit in the processed data unit will be "1", which will not be programmed.

Table 2 includes an input data unit, an array data unit, a processed data unit, and a resulting data unit (the data unit stored in a corresponding set of memory cells resulting from the program operation of programming the processed data unit) according to an exemplary embodiment.

TABLE 2

|  | Bit-0 | Bit-1 | Bit-2 | Bit-3 | Bit-4 | Bit-5 | Bit-6 | Bit-7 |
| --- | --- | --- | --- | --- | --- | --- | --- | --- |
| Array data unit | 1 | 0 | 1 | 0 | 1 | 0 | 1 | 0 |
| Input data unit | 0 | 1 | 0 | 1 | 0 | 0 | 1 | 0 |

TABLE 2-continued

|  | Bit-0 | Bit-1 | Bit-2 | Bit-3 | Bit-4 | Bit-5 | Bit-6 | Bit-7 |
| --- | --- | --- | --- | --- | --- | --- | --- | --- |
| Processed data unit | 0 | 1 | 0 | 1 | 0 | 1 | 1 | 1 |
| Resulting data unit | 0 | 0 | 0 | 0 | 0 | 0 | 1 | 0 |

As shown in Table 2, when the array data unit is "10101010" and the input data unit is "01010010," the processed data unit will be "01010111". Then, after the program operation, the data unit stored in the corresponding set of memory cells will be "00000010".

At step 440, control unit 120 controls data processor 170 to write the processed data unit into data register 180, and to associate the processed data unit written in data register 180 with address n.

At step 450, control unit 120 determines whether the current input data unit is the last input data unit in the series of input data units 258. If the current input data unit is not the last input data unit in the series of input data units 258 (step 450: No), then, at step 460, control unit 120 increments address n by 1, i.e., n=n+1. After step 460, control unit 120 returns to step 410 to receive another input data unit associated with the incremented address n. If the current input data unit is the last input data unit in the series of input data units 258 (step 450: Yes), process 400 ends.

Figure 5:
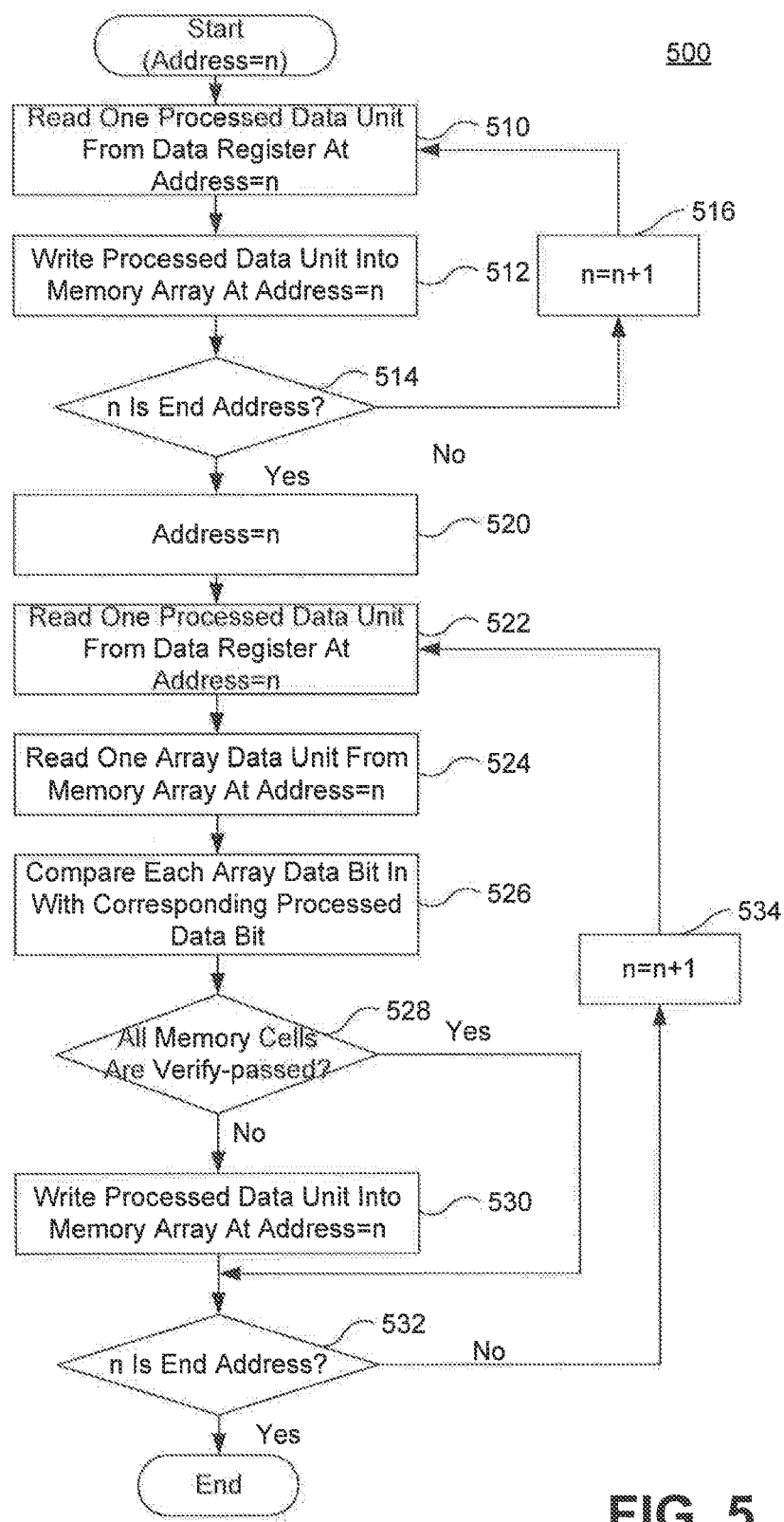
FIG. 5 is a flow chart illustrating a process of executing another step in the process of FIG. 3, according to an illustrated embodiment.

FIG. 5 is a flow chart illustrating a process 500 for executing step 340 in FIG. 3, according to an illustrated embodiment. Process 500 can be executed by control unit 120 of FIG. 1.

At the beginning of process 500, control unit 120 sets the current address to a starting address n, which is the initial address originally received from the external device, At step 510, control unit 120 reads a processed data unit from data register 180 that is associated with address n. At step 512, control unit 120 writes the processed data unit into a set of memory cells of memory array 110 at address n.

During step 512, control unit 120 writes all of the processed data bits in the processed data unit into the set of memory cells corresponding to address n. In some embodiments, when memory device 100 is a flash memory device, if a processed data bit is "0", control unit 120 applies a program voltage to a memory cell corresponding to the processed data bit to write "0" into the memory cell; and if a processed data bit is "1", control unit 120 does not apply the program voltage to the corresponding memory cell, and thus the memory cell is not programmed and the data stored in the memory cell remains unchanged At step 514, control unit 120 determines whether the current address n is an end address. The end address represents an address in memory array 110 into which the last processed data unit is to be written. In some embodiments, the end address can be included in instruction sequence 250 supplied to the SI pin of memory device 100. In other embodiments, control unit 120 can include a counter to counter the number of input data units 258 included in instruction sequence 250, and when an input data unit 258 is the last unit included in instruction sequence 250, control unit 120 determines that the current address n is the end address. If the current address n is not the end address (step 514: No), then, at step 516, control unit 120 increments address n by 1, i.e., n=n+1. After step 516, control unit 120 returns to step 510 to read another processed data unit from data register 180 that is associated with address n.

If current address n is the end address (step 514: Yes), control unit 120 determines that all of the processed data units in data register 180 have been written into the memory cells of memory array 110. Then, control unit 120 performs a verification process to verify that the processed data units have been successfully written into the memory cells of memory array 110.

Specifically, at step 520, control unit 120 resets the current address to starting address n, which is the initial address originally received from the external device. At step 522, control unit 120 reads a processed data unit from data register 180 that is associated with address n. At step 524, control unit 120 controls sense circuit 160 to read an array data unit stored in a set of memory cells of memory array 110 at address n. At step 526, control unit 120 compares each array data bit in the array data unit with its corresponding processed data bit in the processed data unit to determine a verification status of each memory cell that stores an array data bit of the array data unit.

Table 3 summarizes a scheme for determining the verification status of a memory cell.

TABLE 3

| Memory Cell Status | Data bit in Array Data Unit | |
| --- | --- | --- |
| | 0 | 1 |
| Data bit in Processed Data Unit  0 | Verify-passed | Not verify-passed |
| 1 | Verify-passed | Verify-passed |

According to Table 3, if an array data bit is "1", and its corresponding processed data bit is "0", control unit 120 determines that the memory cell that stores the array data bit is not verify-passed, and needs to be re-programmed. Otherwise, if an array data bit is "1", and its corresponding processed data bit is "1", control unit 120 determines that the memory cell that stores the array data bit is verify-passed, and no program operation is needed. Or, if an array data bit is "0", and its corresponding processed data bit is "1" or "0", control unit 120 also determines that the memory cell that stores the array data bit is verify-passed and no program operation is needed.

After determining the verification status of the set of memory cells at address n, at step 528, control unit 120 determines whether all of the memory cells in the set of memory cells are verify-passed. If at least one memory cell is not verify-passed (step 528: No), at step 530, control unit 120 writes the processed data unit into the set of memory cells of memory array 110 at address n. Then, control unit 120 proceeds to step 532. If all of the memory cells in the set of memory cells are verify-passed (step 528: Yes), control unit 120 directly proceeds to step 532.

At step 532, control unit 120 determines whether address n is the end address. If the address n is not the end address (step 532: No), then, at step 534, control unit 120 increments the address n by 1, i.e., n=n+1. After step 534, control unit 120 returns to step 522 to read another processed data unit from data register 180 that is associated with address n. If the address n is the end address (step 532: Yes), process 500 ends.

The sequences of events described in FIGS. 3, 4, and 5 are exemplary and not intended to be limiting. Thus, the particular order of events depicted in FIGS. 3, 4, and 5 can vary without departing from the scope of the disclosed embodiments. In addition, some of the events depicted in FIGS. 3, 4, and 5 can be performed in parallel, i.e., at the same time as each other. For example, referring to FIG. 4, step 410 of receiving the input data unit associated with address n can be performed at the same time as step 420 of reading the array data unit at address n from memory array 110. As another example, step 430 of processing input data unit associated with address n and step 440 of writing processed data unit into data register 180 can be performed at the same time as each other and at the same time as a step of receiving an input data unit associated with an incremented address, i.e., step 410 in the next iteration when address n is incremented (n=n+1).

Figure 6:
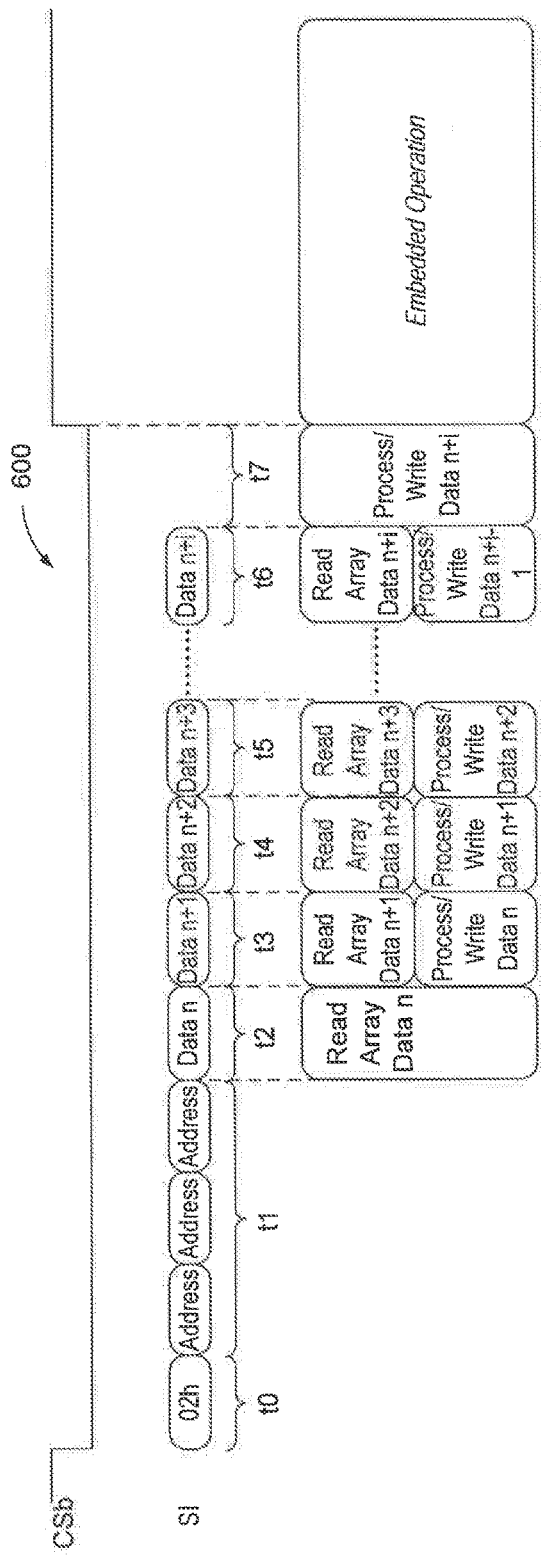
FIG. 6 is a timing diagram of a program process performed on a memory device, according to an illustrated embodiment.

FIG. 6 is a timing diagram of a program process performed on memory device 100, according to the exemplary embodiment described above with reference to FIGS. 3 and 4. According to FIG. 6, when a CSb signal 600 supplied to the CSb pin of memory device 100 is driven from a high level to a low level, control unit 120 receives a program instruction "02h" at time period t0, and receives an address n at time period t1. During time period t2, control unit 120 receives an input data unit associated with address n, and controls sense circuit 160 to read an array data unit associated with address n from memory array 110. During time period t3, control unit 120 receives an input data unit associated with address n+1, and controls data processor 170 to process the input data unit associated with address n to generate a processed data unit associated with address n and write the processed data unit associated with address n into data register 180, and controls sense circuit 160 to read an array data unit associated with address n+1 from memory array 110. During each one of time periods t4 and t5, control unit 120 performs a similar process as in time period t3. Then, during time period t6, control unit 120 receives an input data unit associated with address n+i, and controls data processor 170 to process an input data unit associated with address n+i−1 to generate a processed data unit associated with address n+i−1 and write the processed data unit associated with address n+i−1 into data register 180, and controls sense circuit 160 to read an array data unit associated with address n+i from memory array 110. During time period t7, control unit 120 controls data processor 170 to process the input data unit associated with address n+i to generate a processed data unit associated with address n+i and write the processed data unit associated with address n+i into data register 180. After time period t7, CSb signal 200 is driven from the low level to the high level, and then control unit 120 executes an embedded program operation, such as the operation described with reference to FIG. 5.

In the above described embodiments, a flash memory device in which a memory cell can only be programmed with "0", has been explained as an example. In other embodiments, when memory device 100 is an ReRAM device or a MRAM device, a memory cell can be written with either "1" or "0" by a written operation. Generally, the write operation of such a memory device (ReRAM device or MRAM device) can be divided into a write "1" operation and a write "0" operation. The write "1" operation only writes input data bits of "1" while skipping input data bits of "0". The write "0" operation only writes input data bits of "0" while skipping input data bits of "1".

According to an embodiment of the present disclosure, when a memory device such as an ReRAM device or a MRAM device receives an input data unit, the memory device reads an array data unit from a memory array included in the memory device, and processes the input data unit based on the array data unit to generate a first processed data unit for the write "1" operation and a second processed data unit for the write "0" operation. Then, the memory device stores the first processed data unit and the second processed data unit into a data register (e.g., data register 180 in FIG. 1). Subsequently, the memory device performs the write "1" operation according to the first processed data unit, and performs the write "0" operation according to the second processed data unit.

When generating the first processed data unit, if both of the input data bit and the array data bit are "1", the memory device changes the input data bit of "1" to "0" to generate a processed data unit of "0", Then, when performing the write "1" operation in a following step, only processed data bits of "1" will be written, while processed data bits of "0" will not be written. In such manner, over-programming of "1" will be avoided.

When generating the second processed data unit, if both of the input data bit and the array data bit are "0", the memory device changes the input data bit of "0" to "1" to generate a processed data unit of "1". Then, when performing the write "0" operation in a following step, only processed data bits of "0" will be written, while processed data bits of "1" will not be written. In such manner, over-programming of "0" will be avoided.

Table 4 includes an array data unit, an input data unit, a first processed data unit, a second processed data unit, and a resulting data unit (the data unit resulting in the corresponding set memory cells resulting from the write "1" operation and the write "0" operation) according to an exemplary embodiment.

TABLE 4

|  | Bit-0 | Bit-1 | Bit-2 | Bit-3 | Bit-4 | Bit-5 | Bit-6 | Bit-7 |
|---|---|---|---|---|---|---|---|---|
| Array data unit | 1 | 0 | 1 | 0 | 1 | 0 | 1 | 0 |
| Input data unit | 0 | 1 | 0 | 1 | 1 | 0 | 1 | 0 |
| First Processed data unit | 0 | 1 | 0 | 1 | 0 | 0 | 0 | 0 |
| Second Processed data unit | 0 | 1 | 0 | 1 | 1 | 1 | 1 | 1 |
| Resulting data unit | 0 | 1 | 0 | 1 | 1 | 0 | 1 | 0 |

As shown in Table 4, when the array data unit is "10101010" and the input data unit is "01011010," the first processed data unit will be "01010000" and the second processed data unit will be "01011111." Then, after the write "1" operation and the write "0" operation the data unit stored in the corresponding set of memory cells will be "01011010," which is the same as the input data unit.

In the above described embodiments, data units consisting of eight (8) data bits have been described as an example. It will now be apparent to those skilled in the art that the memory device and the programming method of the disclosed embodiments can be applied to data units consisting of greater or fewer than 8 data bits.

In addition, in the above described embodiments, single level memory cells each storing a single data bit have been described as an example. It will now be apparent to those skilled in the art that the memory device and the programming method of the disclosed embodiments can be applied to multiple level memory cells each storing two or more data bits.

For purposes of explanation only, certain aspects and embodiments are described herein with reference to the components illustrated in FIG. 1. It will now be apparent to those skilled in the art that the functionality of the illustrated components can overlap, and can be present in a fewer or greater number of elements and components. Further, all or part of the functionality of the illustrated elements can co-exist on a single integrated circuit chip or be distributed among several integrated circuit chips. Moreover, embodiments, features, aspects, and principles disclosed herein can be implemented in various environments and are not limited to the illustrated environments.

Further, certain process stages depicted in FIGS. 3, 4, and 5 can be omitted and additional stages can be implemented in FIGS. 3, 4, and 5. Also, the processes described herein are not inherently related to any particular system or apparatus and can be implemented by any suitable combination of components.

The memory device and the program method according to the disclosed embodiments have advantages over conventional art. First, the program method processes the series of the input data units while receiving the series of input data units, i.e., before the embedded programming operation. Thus, the time required for performing the embedded programming operation is decreased. Second, the program method processes input data units based on array data units stored in memory array 110, thus avoiding the over-programming scheme of programming "0" into "0".

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:
1. A memory device, comprising:
    a memory array including a plurality of memory cells that store data;
    a sense circuit coupled to the memory array for reading data stored in the memory array;
    a data register for storing data to be written into the memory array;
    a data processor configured to:
        receive a first input data unit to be written into the memory array;
        process the first input data unit based on a first array data unit stored in the memory array to generate a first processed data unit;
        write the first processed data unit into the data register;
        receive a second input data unit to be written into the memory array;
        process the second input data unit based on a second array data unit stored in the memory array to generate a second processed data unit;
        write the second processed data unit into the data register; and
    a control unit configured to write the first and second processed data units in the data register into the memory array,
    wherein the data processor is configured to process the first input data unit and write the first processed data unit into the data register during the same time as receiving the second input data unit.
2. The memory device of claim 1, wherein the data processor is configured to, when receiving the first input data unit to be written into the memory array, processing the first input data unit based on the first array data unit stored in the memory array to generate the first processed data unit, and writing the first processed data unit in the data register into the data register:
    receive the first input data unit associated with an initial address;

receive the first array data unit from the sense circuit, the first array data unit being stored in the memory array at the initial address;
process the first input data unit based on the first array data unit to generate a first processed data unit; and
write the first processed data unit into the data register and associate the first processed data unit with the initial address.

3. The memory device of claim 2, wherein the first input data unit includes a fixed number of input data bits, the first array data unit includes the fixed number of array data bits respectively corresponding to the input data bits in the first input data unit, and the first processed data unit includes the fixed number of processed data bits respectively corresponding to the input data bits in the first input data unit,
the data processor being configured to, when processing the first input data unit based on the first array data unit to generate the first processed data unit:
compare each input data bit in the first input data unit with the corresponding one of the array data bits in the first array data unit; and
if both of the input data bit and its corresponding array data bit are "0", change the input data bit from "0" to "1" to generate a processed data bit of "1" as the corresponding processed data bit.

4. The memory device of claim 2, wherein the data processor is further configured to:
increment the initial address to generate an incremented address;
receive the second input data unit associated with the incremented address;
receive the second array data unit from the sense circuit, the second array data unit being stored in the memory array at the incremented address;
and
associate the second processed data unit with the incremented address.

5. The memory device of claim 4, wherein the control unit is further configured to, when writing the first and second processed data units in the data register into the memory array:
read the first processed data unit from the data register associated with the initial address; and
write the first processed data unit into the memory array at the initial address.

6. The memory device of claim 5, wherein the control unit is further configured to:
increment the initial address;
read the second processed data unit from the data register associated with the incremented address; and
write the second processed data unit into the memory array at the incremented address.

7. The memory device of claim 1, wherein the control unit is further configured to verify the data written in the memory array.

8. A method for programming a memory array, comprising:
receiving a first input data unit to be written into the memory array;
processing the first input data unit based on a first array data unit stored in the memory array to generate a first processed data unit;
writing the first processed data unit into a data register;
receiving a second input data unit to be written into the memory array;
processing the second input data unit based on a second array data unit stored in the memory array to generate a second processed data unit;
writing the second processed data unit into the data register; and
writing the first and second processed data units in the data register into the memory array,
wherein the processing the first input data unit and writing the first processed data unit into the data register are performed during the same time as receiving the second input data unit.

9. The method of claim 8, wherein receiving the first input data unit to be written into the memory array, processing the first input data unit based on the first array data unit stored in the memory array to generate the first processed data unit, and writing the first processed data unit into the data register includes:
receiving an initial address;
receiving the first input data unit associated with the initial address;
reading the first array data unit from the memory array at the initial address;
processing the first input data unit based on the first array data unit to generate a first processed data unit; and
writing the first processed data unit into the data register and associating the first processed data unit with the initial address.

10. The method of claim 9, wherein the first input data unit includes a fixed number of input data bits, the first array data unit includes the fixed number of array data bits respectively corresponding to the input data bits in the first input data unit, and the first processed data unit includes the fixed number of processed data bits respectively corresponding to the input data bits in the first input data unit,
processing the first input data unit based on the first array data unit to generate the first processed data unit including:
comparing each input data bit in the first input data unit with the corresponding one of the array data bits in the first array data unit; and
if both of the input data bit and its corresponding array data bit are "0", changing the input data bit from "0" to "1" to generate a processed data bit of "1" as the corresponding processed data bit.

11. The method of claim 9, further including:
incrementing the initial address to generate an incremented address;
receiving the second input data unit associated with the incremented address;
reading the second array data unit from the memory array at the incremented address;
and
associating the second processed data unit with the incremented address.

12. The method of claim 11, wherein writing the first and second processed data units in the data register into the memory array includes:
reading the first processed data unit from the data register associated with the initial address; and
writing the first processed data unit into the memory array at the initial address.

13. The method of claim 12, further including:
incrementing the initial address;
reading the second processed data unit from the data register associated with the incremented address; and
writing the second processed data unit into the memory array at the incremented address.

14. The method of claim 8, further including:
verifying the data written in the memory array.

15. A method for programming a memory array, comprising:
- receiving an initial address;
- receiving a first input data unit to be written into the memory array at the initial address;
- reading a first array data unit from the memory array at the initial address;
- processing the first input data unit based on the first array data unit to generate a first processed data unit;
- writing the first processed data unit into a data register and associating the first processed data unit with the initial address;
- incrementing the initial address to generate an incremented address;
- receiving a second input data unit to be written into the memory array at the incremented address;
- reading a second array data unit from the memory array at the incremented address;
- processing the second input data unit based on the second array data unit to generate a second processed data unit;
- writing the second processed data unit into the data register and associating the second processed data unit with the incremented address; and
- writing the first and second processed data units in the data register into the memory array,
- wherein processing the first input data unit based on the first array data unit to generate a first processed data unit and writing the first processed data unit into the data register are performed while receiving the second input data unit.

* * * * *